United States Patent
Nobbe et al.

(10) Patent No.: US 11,444,583 B2
(45) Date of Patent: *Sep. 13, 2022

(54) SYSTEMS AND METHODS FOR OPTIMIZING AMPLIFIER OPERATIONS

(71) Applicant: pSemi Corporation, San Diego, CA (US)

(72) Inventors: Dan William Nobbe, Crystal Lake, IL (US); David Halchin, Summerfield, NC (US)

(73) Assignee: pSemi Corporation, San Diego, CA (US)

( * ) Notice: Subject to any disclaimer, the term of this patent is extended or adjusted under 35 U.S.C. 154(b) by 111 days.

This patent is subject to a terminal disclaimer.

(21) Appl. No.: 16/737,783

(22) Filed: Jan. 8, 2020

(65) Prior Publication Data

US 2020/0228068 A1 Jul. 16, 2020

Related U.S. Application Data

(60) Continuation of application No. 16/166,020, filed on Oct. 19, 2018, now Pat. No. 10,601,377, which is a
(Continued)

(51) Int. Cl.
| | |
|---|---|
| *H03G 3/20* | (2006.01) |
| *H03F 1/32* | (2006.01) |
| *H03F 1/30* | (2006.01) |
| *H03F 3/195* | (2006.01) |
| *H03F 3/72* | (2006.01) |

(Continued)

(52) U.S. Cl.
CPC ......... *H03F 1/3223* (2013.01); *H03F 1/0205* (2013.01); *H03F 1/30* (2013.01); *H03F 3/193* (2013.01); *H03F 3/195* (2013.01); *H03F 3/72* (2013.01); *H03G 3/3036* (2013.01); *H03F 2200/105* (2013.01); *H03F 2200/324* (2013.01);
(Continued)

(58) Field of Classification Search
CPC ...... H03F 1/3223; H03F 1/0205; H03F 3/193; H03F 1/30; H03F 3/195; H03F 3/72; H03F 2200/324; H03F 2200/387; H03F 2200/451; H03F 2200/105; H03F 2200/468; H03G 3/3036
USPC .................. 330/136, 127, 10, 149, 151, 297
See application file for complete search history.

(56) References Cited

U.S. PATENT DOCUMENTS

| | | |
|---|---|---|
| 6,396,344 B1 | 5/2002 | Gentzler et al. |
| 6,714,071 B1 | 3/2004 | Page |

(Continued)

FOREIGN PATENT DOCUMENTS

WO WO2009/108391 9/2009

OTHER PUBLICATIONS

Nguyen, Khiem D., Office Action received from the USPTO dated Sep. 11, 2015 for U.S. Appl. No. 13/828,121, 12 pgs.
(Continued)

*Primary Examiner* — Khanh V Nguyen
*Assistant Examiner* — Khiem D Nguyen
(74) *Attorney, Agent, or Firm* — Jaquez Land Greenhaus & McFarland LLP; John Land, Esq.

(57) ABSTRACT

Methods and systems for optimizing amplifier operations are described. The described methods and systems particularly describe a feed-forward control circuit that may also be used as a feed-back control circuit in certain applications. The feed-forward control circuit provides a control signal that may be used to configure an amplifier in a variety of ways.

21 Claims, 7 Drawing Sheets

Related U.S. Application Data continuation of application No. 15/487,328, filed on Apr. 13, 2017, now Pat. No. 10,141,895, which is a continuation of application No. 14/794,699, filed on Jul. 8, 2015, now Pat. No. 9,712,120, which is a division of application No. 13/828,121, filed on Mar. 14, 2013, now Pat. No. 9,595,923.

(51) Int. Cl.
  *H03F 1/02* (2006.01)
  *H03F 3/193* (2006.01)
  *H03G 3/30* (2006.01)

(52) U.S. Cl.
  CPC .. *H03F 2200/387* (2013.01); *H03F 2200/451* (2013.01); *H03F 2200/468* (2013.01)

(56) References Cited

U.S. PATENT DOCUMENTS

| | | | |
|---|---|---|---|
| 6,804,502 B2 | 10/2004 | Burgener et al. | |
| 6,825,725 B1 | 11/2004 | Doherty et al. | |
| 6,873,208 B2 | 3/2005 | Shijo et al. | |
| 6,882,220 B2 | 4/2005 | Doherty et al. | |
| 6,917,243 B2 | 7/2005 | Doherty et al. | |
| 7,170,341 B2 | 1/2007 | Conrad et al. | |
| 7,193,460 B1 | 3/2007 | Naik et al. | |
| 7,202,734 B1 | 4/2007 | Raab | |
| 7,248,120 B2 | 7/2007 | Burgener et al. | |
| 7,496,334 B2 | 2/2009 | Saito | |
| 7,629,843 B2 | 12/2009 | Paul et al. | |
| 7,795,968 B1 | 9/2010 | Li et al. | |
| 7,910,993 B2 | 3/2011 | Brindle et al. | |
| 7,911,277 B2 | 3/2011 | Paul et al. | |
| 8,018,277 B2 | 9/2011 | Drogi et al. | |
| 8,244,194 B2 | 8/2012 | Morgan et al. | |
| 8,391,812 B2 | 3/2013 | Trainor et al. | |
| 8,706,064 B2 | 4/2014 | Trainor et al. | |
| 9,099,962 B2 | 8/2015 | Trainor et al. | |
| 9,595,923 B2 | 3/2017 | Nobbe et al. | |
| 9,712,120 B2 | 7/2017 | Nobbe et al. | |
| 10,141,895 B2 | 11/2018 | Nobbe et al. | |
| 10,601,377 B2 | 3/2020 | Nobbe et al. | |
| 2008/0278231 A1 | 11/2008 | Murao | |
| 2013/0222075 A1 | 8/2013 | Reedy et al. | |
| 2014/0266433 A1 | 9/2014 | Nobbe et al. | |
| 2014/0266460 A1 | 9/2014 | Nobbe et al. | |
| 2016/0190999 A1 | 6/2016 | Nobbe et al. | |
| 2017/0338779 A1 | 11/2017 | Nobbe et al. | |
| 2019/0097588 A1 | 3/2019 | Nobbe et al. | |
| 2020/0111756 A1 | 4/2020 | Smith et al. | |

OTHER PUBLICATIONS

Nguyen, Khiem D., Final Office Action received from the USPTO dated Mar. 23, 2015 for U.S. Appl. No. 13/828,121, 13 pgs.
Nguyen, Khiem D., Advisory Action received from the USPTO dated Jun. 16, 2015 for U.S. Appl. No. 13/828,121, 7 pgs.
Nguyen, Khiem D.,Notice of Non-Compliant Amendment received from the USPTO dated Jun. 29, 2015 for U.S. Appl. No. 13/828,121, 2 pgs.
Nobbe, et al., Amendment filed in the USPTO dated Jan. 5, 2015 for U.S. Appl. No. 13/828,121, 17 pgs.
Nobbe, et al., Amendment filed in the USPTO dated May 28, 2015 for U.S. Appl. No. 13/828,121, 15 pgs.
Nobbe, et al., Amendment filed in the USPTO dated Jun. 30, 2015 for U.S. Appl. No. 13/828,121, 15 pgs.
Nguyen, Khiem D., Notice of Allowance received from the USPTO dated Oct. 26, 2016 for U.S. Appl. No. 13/828,121, 8 pgs.
Nguyen, Khiem, Final Office Action received from the USPTO dated Aug. 11, 2016 for U.S. Appl. No. 13/828,121, 10 pgs.
Nobbe, et al., Response After Final Office Action filed in the USPTO dated Sep. 30, 16 for U.S. Appl. No. 13/828,121, 14 pgs.
Nguyen, Khiem D., Office Action received from the USPTO dated Mar. 24, 2016 for U.S. Appl. No. 13/828,121, 17 pgs.
Nobbe, et al., Amendment filed in the USPTO dated Apr. 19, 2016 for U.S. Appl. No. 13/828,121, 24 pgs.
Nobbe, et al., Amendment filed in the USPTO dated Dec. 10, 2015 for U.S. Appl. No. 13/828,121, 18 pgs.
Nguyen, Khiem D., Office Action received from the USPTO dated Feb. 9, 2018 for U.S. Appl. No. 15/487,328, 10 pgs.
Nguyen, Khiem D., Final Office Action received from the USPTO dated May 31, 2018 for U.S. Appl. No. 15/487,328, 7 pgs.
Nguyen, Khiem D., Notice of Allowance received from the USPTO dated Jul. 23, 2018 for U.S. Appl. No. 15/487,328, 8 pgs.
Nobbe, et al., Response filed in the USPTO dated Feb. 15, 2018 for U.S. Appl. No. 15/487,328, 9 pgs.
Nobbe, et al., Response filed in the USPTO dated Jun. 7, 2018 for U.S. Appl. No. 15/487,328, 7 pgs.
Nguyen, Khiem D., Office Action received from the USPTO dated May 31, 2019 for U.S. Appl. No. 16/166,020, 12 pgs.
Nguyen, Khiem D., Notice of Allowance received from the USPTO dated Nov. 8, 2019 for U.S. Appl. No. 16/166,020, 5 pgs.
PSEMI Corporation, Response filed in the USPTO dated Aug. 23, 19 for U.S. Appl. No. 16/166,020, 13 pgs.
PSEMI Corporation, Preliminary Amendment filed in the USPTO dated Dec. 12, 2018 for U.S. Appl. No. 16/166,020, 7 pgs.
Nguyen, Khiem D., Office Action received from the USPTO dated Jul. 28, 2016 for U.S. Appl. No. 14/794,699, 24 pgs.
Nguyen, Khiem D., Final Office Action received from the USPTO dated Mar. 9, 2017 for U.S. Appl. No. 14/794,699, 11 pgs.
Nguyen, Khiem D., Notice of Allowance received from the USPTO dated May 5, 2017 for U.S. Appl. No. 14/794,699, 5 pgs.
Nobbe, et al., Response filed in the USPTO dated Oct. 7, 2016 for U.S. Appl. No. 14/794,699, 16 pgs.
Nobbe, et al., Response After Final Office Action filed in the USPTO dated Apr. 10, 2017 for U.S. Appl. No. 14/794,699, 9 pgs.
Kim, et al. "Efficiently Amplified", IEEE Microwave Magazine, Aug. 2010, pp. 87-100.
Bagcock, Wallace. "Intermodulation Interference in Radio Systems." The Bell System Technical Journal, Jan. 1953, pp. 63-73.
Moon, et al. "Highly Efficient Saturated Power Amplifier" IEEE Microwave Magazine, Jan./Feb. 2012, pp. 125-131.
McCune, et al. "Microwave Bytes." IEEE Microwave Magazine, Jun. 2012, pp. 34-56.
Wang et al. "MM-Wave Integration and Combinations." IEEE Microwave Magazine, Jul./Aug. 2012, pp. 49-57.
Leifso, et al. "A fully Integrated Active Inductor with Independent Voltage Tunable Inductance and Series-Loss Resistance" IEEE Transaction on Microwave Theory and Techniques, vol. 49, No. 4, Apr. 2001, pp. 671-676.
Hedayati, et al. "A 2-GHz Highly Linear Efficient Dual-Mode BiCMOS Power Amplifier Using a Reconfigurable Matching Network" IEEE Journal of Solid-State Circuits, 2012, pp. 1-20.
Asbeck, et al. "Si IC Development for High Efficiency Envelope Tracking Power Amplifiers" SiRF, IEEE, 2012, pp. 1-4.
Kawai, et al. "Ring Resonators for Bandwidth and Center Frequency Tunable Filter" Proceedings of the 37th European Conference, Oct. 2007, Munich, Germany, pp. 298-301.
Li, et al. "Design of High Efficiency Monolithic Power Amplifier With Envelope-Tracking and Transistor Resizing for Broadband Wireless Applications" IEEE Journal of Solid-State Circuits, vol. 47, No. 9, Sep. 2012, pp. 1-12.
Oh, et al. "A Fully-Integrated +23-dBm CMOS Triple Cascode Linear Power Amplifier with Inner-Parallel Power Control Scheme" Department of EECS, Korea Advanced Institute of Science and Technology, pp. 1-4.
Wimpenny, et al. "Envelope Tracking GaAs HBT PA performance characterization under high load mismatch conditions" PAWR, IEEE, 2012, pp. 37-40.
Kihara, et al. "A Multiband LTE SAW-less CMOS Transmitter with Source-Follower-Drived Passive Mixers, Envelope-Tracked RF-PGAs, and Marchand Baluns" IEEE Radio Frequency Integrated Circuits Symposium, 2012, pp. 399-402.

(56) References Cited

OTHER PUBLICATIONS

Calvo, Carlos, "Calibration and temperature-compensation techniques using an rms-responding RF detector", Microwave/Millimeter-Wave Technology, www.rfdesign.com, Aug. 2006, pp. 28-35.

Choi, et al., "A MMIC Smart Power Amplifier with On-Chip dynamic Bias Controller for WCDMA Mobile Communication", School of Engineering, Information and Communications University (ICU), IEEE 2004, pp. 351-354.

Hau, et al., "A WCDMA HBT Power Amplifier Module with Integrated Si DC Power Management IC for Current Reduction under Backoff Operation", 2007 IEEE Radio Frequency Integrated Circuits Symposium, pp. 75-78.

Degani, et al., "A 90nm CMOS PA Module for 4G applications with embedded PVT gain compensation circuit", Mobility Wireless Group, Intel Israel (74) LTD., IEEE 2012, pp. 25-28.

Kim, et al., "A Power Efficient W-CMDA Smart Power Amplifier With Emitter Area Adjusted For Output Power Levels", 2004 IEEE MTT-S Digest, pp. 1165-1168.

Kim, et al., "High Efficiency and Linear Dual Chain Power Amplifier without/with Automatic Bias Current Control for CDMA Handset Applications", 12th GAAS Symposium—Amsterdam, 2004, pp. 531-534.

Sahu, et al., "A High Efficiency WCDMA RF Power Amplifier with Adaptive, Dual-Mode Buck-Boost Supply and Bias-Current Control", Manuscript received on May 9, 2006, revised on Sep. 1, 2006, IEEE, pp. 1-3.

Sankey, et al., "Adaptive Tuning for Handheld Transmitters" IMS 2009, IEEE 2009, pp. 225-228.

Noh, et al., "An Intelligent Power Amplifier MMIC Using a New Adaptive Bias Control Circuit for W-CDMA Applications", IEEE Journal of Solid-State Circuits, vol. 39, No. 6, Jun. 2004, pp. 967-970.

Kousai, et al., "A 28.3mW PA-Closed Loop for Linearity and Efficiency Improvement Integrated in a +27.1dBm WCDMA CMOS Power Amplifier", ISSCC 2012, Session 4, RF Techniques, 4.6, 3 pgs.

Mohamed, et al. "Novel Reconfigurable Fundamental/Harmonic Matching Network for Enhancing the Efficiency of Power Amplifiers" 40th European Microwave Conference, Sep. 2010, pp. 1122-1125.

Tu, Steve, "A Power-Adaptive CMOS Class E RF Tuned Power Amplifier for Wireless Communications" IEEE, 2003, pp. 365-368.

Kim, et al. "A Linear Multi-Mode CMOS Power Amplifier With Discrete Resizing and Concurrent Power Combining Structure" IEEE Journal of Solid-State Circuits vol. 46, No. 5, May 2011, pp. 1034-1048.

Ahmed, et al. "DTX: A Revolutionary Digital Transmitter Technology to Provide Multi-Mode/Multi-Band Capability" Proceeding of the SDR 04 Technical Conference and Product Exposition, 2004, pp. 1-5.

Kanda, et al. "A Fully Integrated Triple-Band CMOS Power Amplifier for WCDMA Mobile Handsets" IEEE International Solid-State Circuits Conference, Session 4, RF Techniques, 4.7, Feb. 20, 2012, pp. 86-88.

Gamal El Din, et al. "Adaptive Matching for Efficiency Enhancement of Switching Mode and Nonlinear Microwave Power Amplifiers" IEEE, 2010, pp. 192-195.

Vreede, et al. "Ultra-low Distortion Varactors For Adaptive RF Systems" European Microwave Week, Amsterdam, Oct. 2008, 26 pgs.

Asbeck, et al. "CMOS Handset Power Amplifiers: Directions for the Future" IEEE, 2012, 6 pgs.

Kim, et al. "A Multi-Band Reconfigurable Power Amplifier for UMTS Handset Applications" IEEE Radio Frequency Integrated Circuits Symposium, 2010, pp. 175-178.

Asbeck, et al. "Design Options for High Efficiency Linear Handset Power Amplifiers" IEEE, 2009, pp. 1-4.

Nguyen, Khiem D., Office Action received from the USPTO dated Sep. 4, 2014 for U.S. Appl. No. 13/828,121, 19 pgs.

SYSTEMS AND METHODS FOR OPTIMIZING AMPLIFIER OPERATIONS

CROSS REFERENCE TO RELATED APPLICATIONS

This application is a continuation of co-pending U.S. patent application Ser. No. 16/166,020, filed Oct. 19, 2018 entitled "Systems and Methods for Optimizing Amplifier Operations"; and said application Ser. No. 16/166,020 is a continuation of co-pending U.S. patent application Ser. No. 15/487,328 filed Apr. 13, 2017 entitled "Systems and Methods for Optimizing Amplifier Operations" (now U.S. Pat. No. 10,141,895, issued Nov. 27, 2018); and said application Ser. No. 15/487,328 is a continuation of commonly owned U.S. patent application Ser. No. 14/794,699 filed Jul. 8, 2015 entitled "Systems and Methods for Optimizing Amplifier Operations" (now U.S. Pat. No. 9,712,120 issued Jul. 18, 2017); and application Ser. No. 14/794,699 is a divisional of, and claims the benefit of priority to, U.S. patent application Ser. No. 13/828,121 filed Mar. 14, 2013 and entitled "Systems and Methods for Optimizing Amplifier Operations" (now U.S. Pat. No. 9,595,923 issued Mar. 14, 2017). This application incorporates by reference the above-identified application Ser. Nos. 13/828,121, 14/794,699, 15/487,328 and 16/166,020 as if set forth in full.

1. FIELD

The present teachings relate to amplifiers. In particular, the present teachings relate to optimizing amplifier operation by providing a feed-forward control signal that is used to affect amplifier operation in one or more ways.

2. DESCRIPTION OF RELATED ART

Amplifier gain is typically maintained over a range of operating conditions by using a feedback control circuit. For example, the feedback control circuit monitors the amplitude of an output signal of the amplifier and detects any variation of this amplitude from a nominal value. Based on the detected variation, the feedback control circuit generates a feedback control signal that is applied back upon the amplifier (input) so as to either increase, or to decrease the amplifier gain and bring the output signal of the amplifier to the nominal value. However, this gain feedback operation may result in adversely impacting the output signal, for example the control loop may be too slow or may become unstable. Furthermore, closed loop operation typically involves more active and/or passive circuit blocks, which can lead to size and power consumption issues. Closed loop systems also have limited bandwidth, and may be susceptible to interference issues as well.

Furthermore, the typical feedback control circuit monitors only a limited set of parameters, for example, the amplitude and/or phase of an output signal and uses these monitored values to modify such parameters of the input signal as the input signal propagates through the amplifier circuit, thus overlooking other parameters that may be of equal or greater importance in certain applications.

SUMMARY

According to a first aspect of the present disclosure, a system for optimizing amplifier operations is provided. The system includes an amplifier configured to receive an input signal and generate therefrom, an output signal having a desired characteristic; and also includes a feed-forward control circuit configured to receive said input signal, analyze said input signal, and generate a control signal that is provided to the amplifier for impressing the desired characteristic upon said output signal.

According to a second aspect of the disclosure, a system for optimizing amplifier operations is provided. The system includes an amplifier configured to receive an input signal and provide an amplitude gain to said input signal; and further includes a control circuit configured to receive said input signal, analyze at least one characteristic of said input signal and generate a control signal that is provided to the amplifier for generating the amplitude gain.

According to a third aspect of the disclosure, a method for optimizing amplifier operations is provided, the method comprising: analyzing an input signal; generating a feed-forward control signal based upon said analyzing; providing the input signal and the feed-forward control signal to an amplifier; and using the feed-forward control signal to modify at least one of a) an operating characteristic of the amplifier or b) a physical aspect of an element contained in the amplifier.

Further aspects of the disclosure are shown in the specification, drawings and claims of the present application.

BRIEF DESCRIPTION OF THE DRAWINGS

Many aspects of the present disclosure can be better understood with reference to the following drawings. The components in the drawings are not necessarily drawn to scale. Instead, emphasis is placed upon clearly illustrating various principles. Moreover, in the drawings, like reference numerals designate corresponding parts throughout the several views.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it will be understood that terminology such as nodes, terminals, voltage drops, circuits, blocks, connections, lines, and coupling are used herein as a matter of convenience for description purposes and should not be interpreted literally in a narrow sense. Furthermore, the words "block" or "functional blocks" as used herein refer not only to a circuit containing discrete components or integrated circuits (ICs), but may also refer to various other elements such as a module, a sub-module, or a mechanical assembly. Similarly, the word "line" as used herein may refer to various connectivity elements such as a wire, a cable, a copper track on a printed circuit board, an optical fiber, or a wireless link. Also, it must be understood that the word "example" as used herein (in whatever context) is intended to be non-exclusionary and non-limiting in nature. A person of ordinary skill in the art will understand the principles described herein and recognize that these principles can be applied to a wide variety of applications using a wide variety of physical elements.

In particular, described herein are some systems and methods pertaining to optimizing amplifier operation by using a feed-forward control circuit. As can be understood by one of ordinary skill in the art, the described systems and methods can be incorporated into a wide variety of amplifier systems, and furthermore such amplifier systems may be used in a variety of devices and applications spanning a variety of operating conditions (frequencies, voltages, power etc). The term feed-forward implies that the control circuit derives a control state or conditions based on inputs to the circuit under control, and not from an output of the circuit under control. If using the output of the circuit under control and feeding it back in a closed loop manner to the input or other control port to lock a control loop would imply a feed-back circuit.

Figure 1:
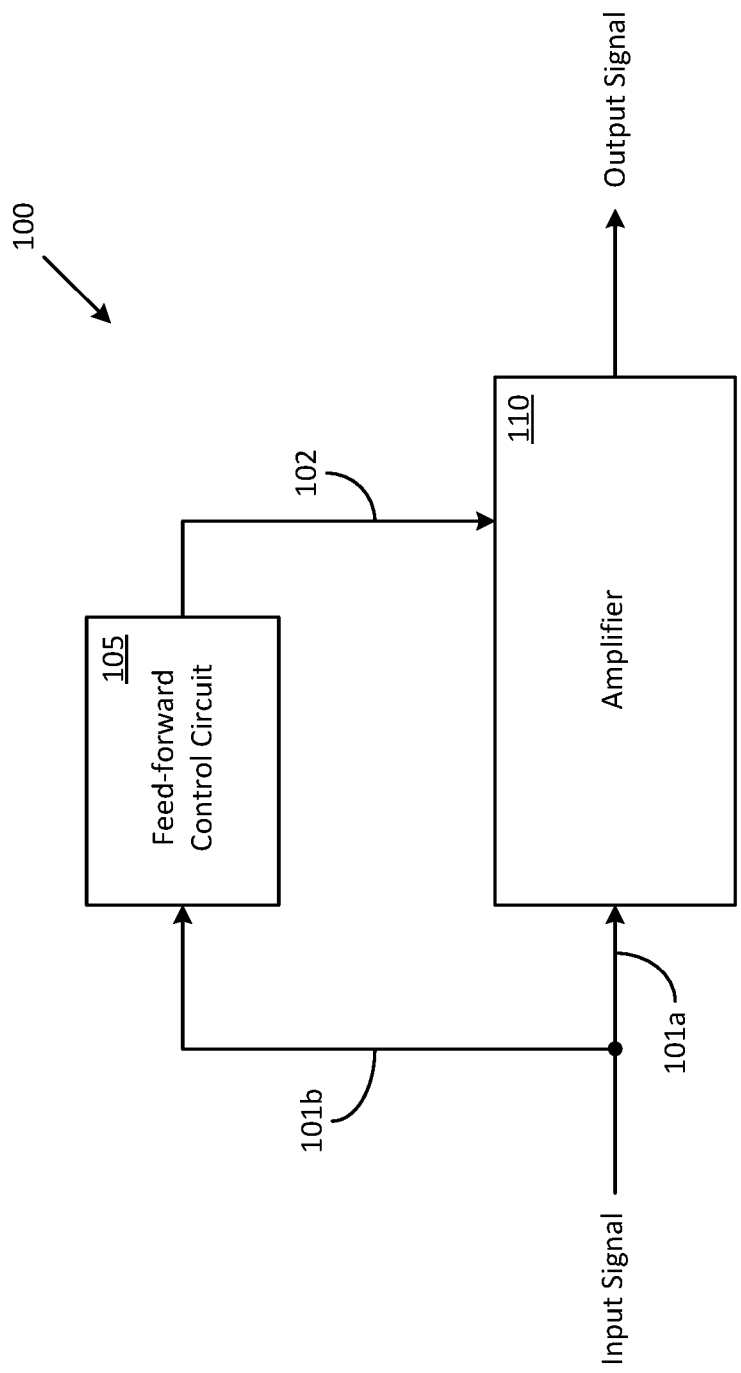
FIG. 1 shows an amplifier system incorporating a feed-forward control circuit coupled to an amplifier.

FIG. 1 shows an amplifier system 100 that includes an amplifier 110 and a feed-forward control circuit 105. An input signal is provided to amplifier 110 via line 101a. The same input signal is also provided to feed-forward control circuit 105 via line 101b. In one example embodiment, the input signal is a radio-frequency (RF) signal. However, it will be understood that the input signal may occupy lower frequency bands, as well as higher frequency bands, in other applications.

Feed-forward control circuit 105 is configured for monitoring one or more parameters of the input signal and using this information to generate a control signal that is provided via line 102 to amplifier 110 in order to modify one or more signal characteristics of the input signal, either by directly affecting the input signal to the amplifier, or by affecting a characteristic of the amplification path the input signal is subjected to within the amplifier. The input signal as affected by the control signal is then provided via line 103 as an output signal from amplifier 110. A few examples of one or more monitoring functions that may be carried out by feed-forward control circuit 105 upon the input signal that is provided to the feed-forward control circuit 105 via line 101b, include: a power level measurement, a frequency measurement, a spectral content measurement, a peak-to-average level variation measurement, a peak-to-minimum level variation measurement, a bandwidth measurement, and/or signal analysis using polar (amplitude and phase) and/or Cartesian coordinates (I & Q components). Some of these functions will be described below in more detail using other figures.

Figure 2:
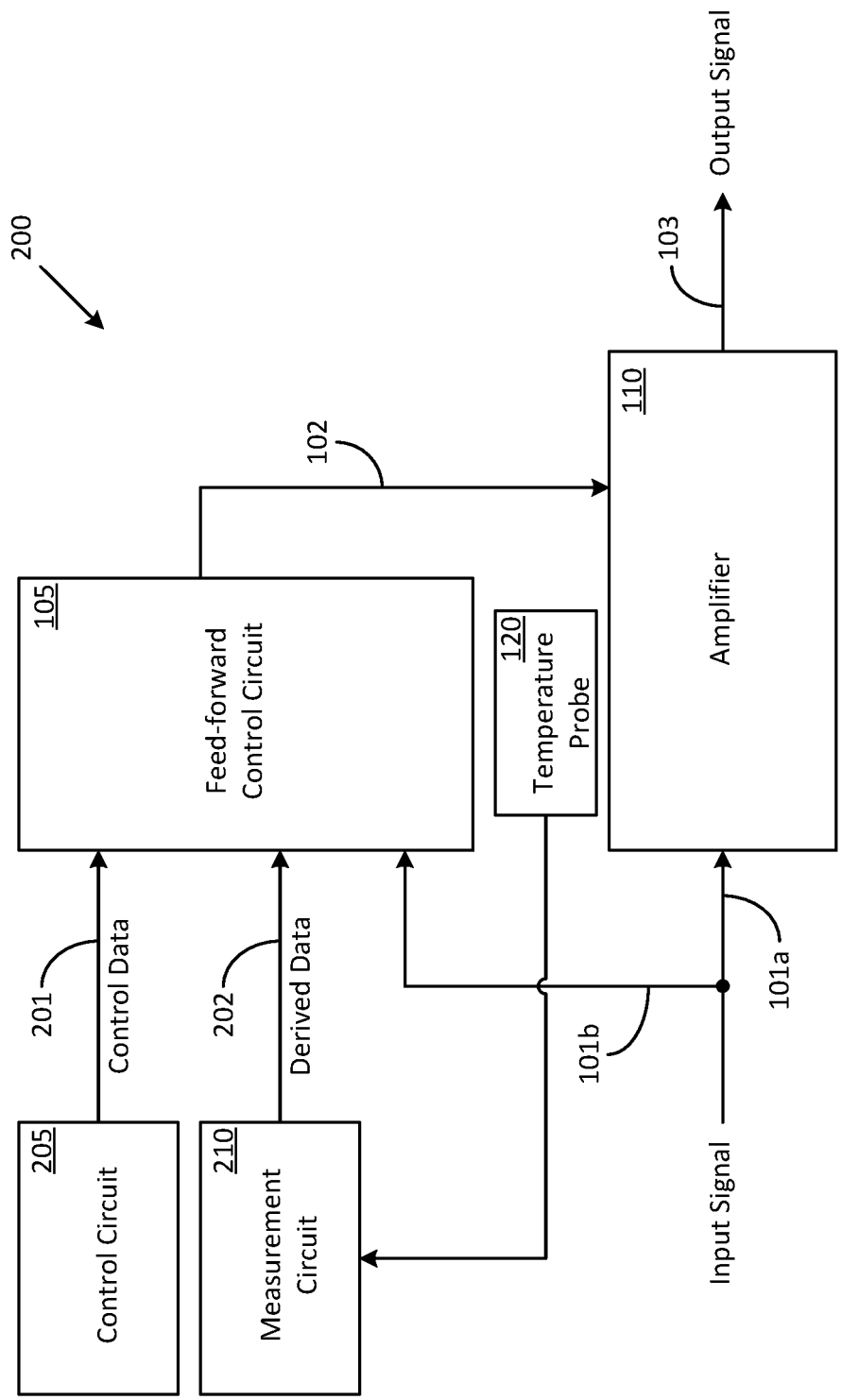
FIG. 2 shows an alternative embodiment of the amplifier system shown in FIG. 1.

FIG. 2 shows an alternative embodiment of the amplifier system 100 shown in FIG. 1. In this alternative embodiment, referred to herein as amplifier system 200, one or more additional inputs in addition to the input signal carried on line 101b, may be provided to feed-forward control circuit 105. Of the two additional inputs shown, a first input includes control data that is provided from a controller 205 via line 201, while a second input includes data that has been derived in a measurement circuit 210 and provided to feed-forward control circuit 105 via line 202.

The additional inputs provide information that may be also used by feed-forward control circuit 105 to generate the control signal carried on line 102. In various alternative embodiments, feed-forward control circuit 105 may use only one of the two additional inputs, may use one or both additional inputs in lieu of the input signal provided via line 101b, or may use one or both the additional inputs in a complementary manner in conjunction with the input signal provided via line 101b.

In one embodiment, information derived from the input signal (line 101b) is combined with information derived from one or both of the additional inputs (lines 201 and 202) and the combined information is used to generate the control signal carried on line 102. For example, the information derived from the input signal may pertain to a power level of the input signal, and the information derived from the control data (line 201) may pertain to a desired power level. Feed-forward control circuit uses these two pieces of information to generate a control signal that configures amplifier 110 to produce an output signal (via line 103) at the desired power level. In one embodiment, the control signal is generated autonomously using multiple pieces of information rather than a single piece of information (for example, a feedback signal, or a signal received from a transceiver unit) thereby permitting various control operations to be carried out, some of which are described below. A non-exhaustive list of the multiple pieces of information includes: power level, battery voltage, temperature, peak-to-peak and/or peak-to-average modulation-related measurements, amplifier-specific information, and other information such as incorporated into system 200 during design, factory test and/or calibration. The autonomously derived control signal derived in this manner provides a more intelligent configuration for system 200.

In another embodiment, information derived from the input signal (line 101b) may be used at a first instant in time to derive a first control signal carried on line 102, and at a subsequent instant in time, one or both of the additional inputs (lines 201 and 202) may be used to derive a second control signal that is also carried on line 102. Such an operation may be deemed a time-multiplexing operation and the control signal derived therefrom, a time-multiplexed control signal.

A few examples of other types of information derived by feed-forward control circuit 105 from the control data provided via line 201 includes one or more desired operating conditions for amplifier 110. Such desired operating conditions include for example: a desired level of power consumption from a power supply, a power-down mode, a modulation scheme to be applied upon the input signal, and a reconfiguration of one or more elements (switching, re-routing signal paths etc.) of the amplifier 110.

Controller 205 may be implemented in a variety of ways, such as for example, using a processor circuit, a state machine, and/or a dedicated control circuit formed of various ICs. The control data provided via line 201 may include one or more of the following: instructions such as modulation mode, frequency band, frequency of operation, power level, raw data, trigger conditions, and/or gating logic. It will be understood that the control data provided via line 201 and the derived data provided via line 202 may be implemented in a digital format and/or an analog format. Measurement circuit 210 is described below in more detail using FIG. 4.

Figure 3:
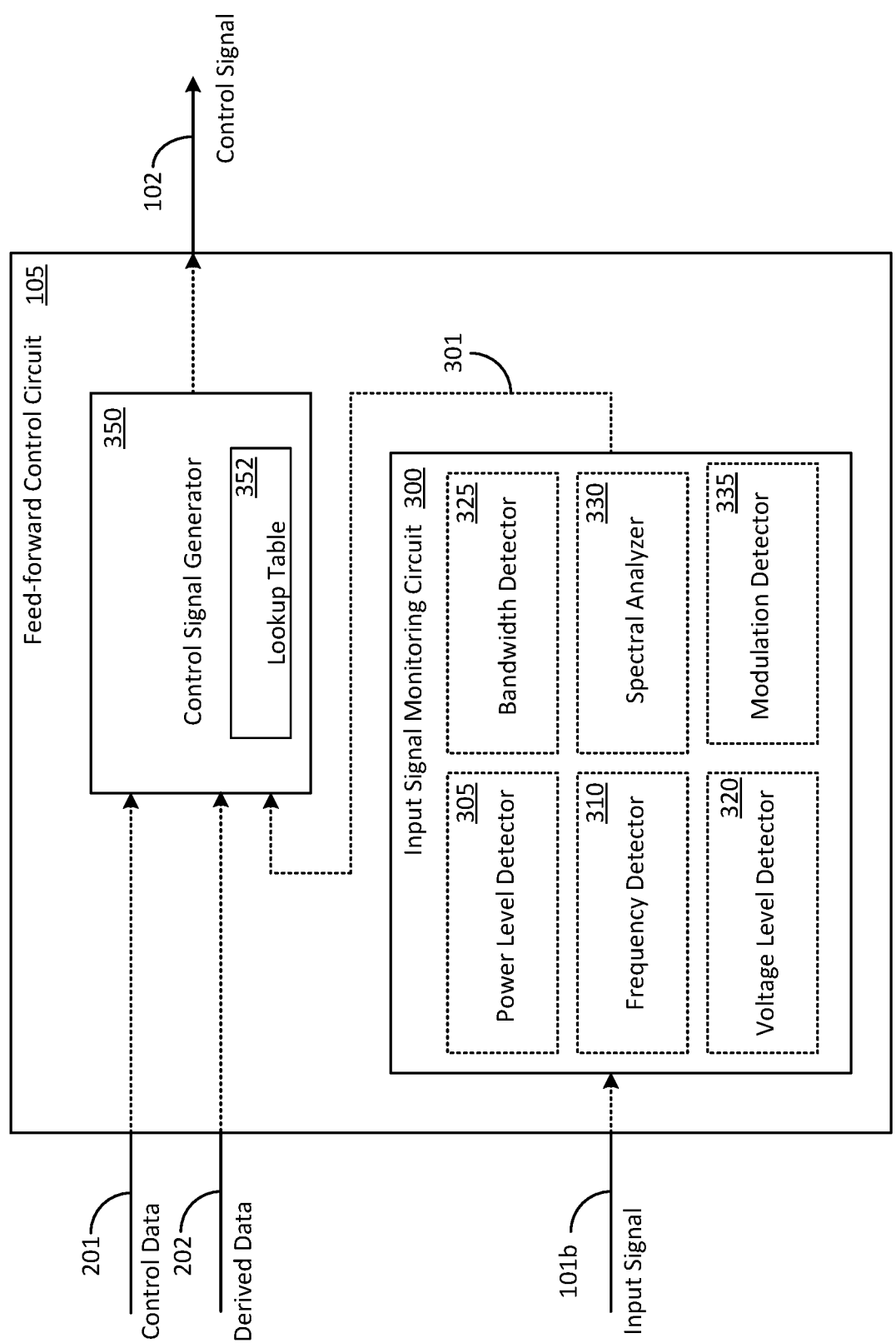
FIG. 3 shows a few components that may be incorporated into the feed-forward control circuit shown in FIG. 1.

Attention is now drawn to FIG. 3, which shows a few components that may be incorporated into feed-forward control circuit 105. It will be noted that several connecting links are shown as dashed lines in order to indicate that there may be one or more functional blocks (not shown) that may be intermedially located in such connecting links. A few examples of such intermedial functional blocks include signal receivers, signal drivers, amplifiers, attenuators, and various signal conditioning circuits. It will also be noted that several functional blocks are shown in dashed lines in order to indicate that these functional blocks may be optionally used. Consequently, in certain applications, one or more of such functional blocks may be included while others may be omitted. Furthermore, it should be understood that the functional blocks shown in FIG. 3 are intended merely as examples for purposes of description and several additional/alternative functional blocks may be used in various implementations.

Input signal monitoring circuit 300 carries out various types of monitoring operations upon the input signal that is fed in via line 101b, and provides a monitoring result (via line 301) to control signal generator 350. Control signal generator 350 may use this monitoring result to generate the control signal on line 102.

Of the various functional blocks shown inside input signal monitoring circuit 300, power level detector 305 may be used to monitor and detect a power level of the input signal. The result of this action is provided to control signal generator 350, which may then use this result in conjunction with control data provided via line 201, to generate a control signal (on line 102) for configuring amplifier 110 to produce the output signal at a desired power level. Thus, if the monitoring result indicates a low power level on the input signal, the control signal on line 102 configures amplifier 110 to boost the power level of the output signal to the desired power level; and vice-versa. The low power level indication may be used for other purposes as well, such as, for example, setting amplifier 110 to operate in a low power mode, or varying operating parameters of amplifier 110, such as bias, setting device size, load line etc. Examples of such operating parameters affecting characteristic response of the amplifier may be found in U.S. application Ser. No. 13/797,779 entitled "Scalable Periphery Tunable Matching Amplifier", filed on Mar. 12, 2013, and incorporated herein by reference in its entirety, now U.S. Pat. No. 9,294,056 B2, issued Mar. 22, 2016.

Frequency detector 310 may be used to monitor and detect one or more frequencies that are present in the input signal. Additional information (e.g. amplitude, distortion level, etc.) pertaining to this detected frequency may also be detected. The result of this action is provided to control signal generator 350, which may then use this result in conjunction with control data provided via line 201 (a desired frequency characteristic, for example) to generate a control signal on line 102 that configures amplifier 110 to impress the desired frequency characteristic upon the output signal. The control signal on line 102 may be used for various other operations such as to tune a passive network inside amplifier 110.

Voltage level detector 320 operates in manner similar to that described above with reference to power level detector 305. Voltage level detection may be employed when the input signal has a lower frequency (audio, base-band etc), while power level detection may be employed when the input signal is an RF signal, for example. The person skilled in the art will understand, upon reading of the present disclosure, that power level detection for RF signals may be appropriate because voltage level detection may be difficult at RF frequencies.

Bandwidth detector 325, spectral analyzer 330, and modulation detector 335, individually or in various combinations with each other, may be used to monitor and identify the spectral nature of the input signal, as well as to measure various parameters such as peak-to-average ratio, peak-to-minimum, modulation bandwidth, etc. The result of this action is provided to control signal generator 350, which may then use the result in conjunction with control data provided via line 201 to generate a control signal (line 102) that configures amplifier 110 to modify a characteristic of the output signal at line 103. The configuring process may include for example, the insertion and/or removal of a frequency-related component (filter, etc) into one or more signal paths in amplifier 110 or for adjusting bias, amplifier device size, matching etc.

Control signal generator 350 uses information provided on one or more lines 201, 202 and 301 to generate the control signal on line 102. In one embodiment (as shown in FIG. 1), control signal generator 350 uses only the monitoring result provided on line 301 by input signal monitoring circuit 300. In this one embodiment, lines 201 and 202 may not be present, and if present, are not used.

In another embodiment, the monitoring result provided on line 301 by input signal monitoring circuit 300 is used in conjunction with one or both the control data and the derived data provided on lines 201 and 202 respectively. Some examples of such usage have been described above.

In an additional example, control signal generator 350 processes the monitoring result provided on line 301 based on certain conditional requirements provided via the control data on line 201. The conditional requirements may be implemented in a logic format. Thus, the control signal that is generated by the control signal generator 350 from the monitoring result, has a first format when the control data provided via line 201 has a first logic state (a logic "1", for example), and has a different format when the control data has a second logic state (a logic "0", for example).

Figure 4:
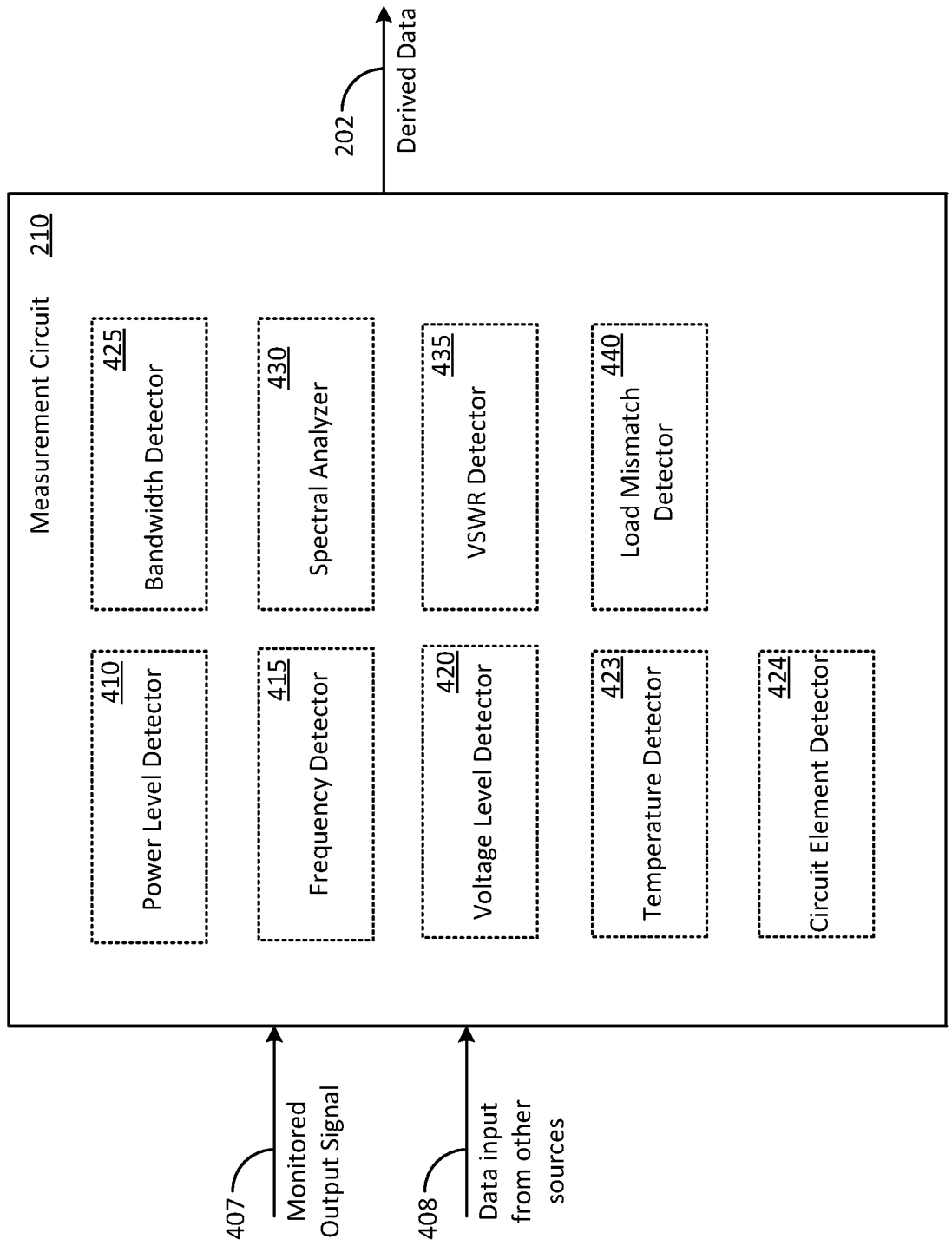
FIG. 4 shows a few components that are contained in a measurement circuit that is used to generate derived data provided to the feed-forward control circuit of FIG. 3.

The nature of the derived data that is provided via line 202 to control signal generator 350 will now be described using FIG. 4, which shows a few components that are contained in measurement circuit 210 and are used to generate the derived data. Functional blocks 410, 415, 420, 425 and 430 operate in manner similar to that described above with reference to functional blocks 305, 310, 320, 325 and 330 of FIG. 3. However, it will be noted that functional blocks 305, 310, 320, 325 and 330 of FIG. 3 operate upon the input signal (provided via line 101b), whereas functional blocks 410, 415, 420, 423, 425 and 430 operate on one or more signals other than the input signal. Two types of such signals are shown in FIG. 4. In one embodiment, one or both of these signals are provided in a digital format, in another embodiment one or both of these signals are provided in an analog format, while in yet another embodiment, one of the signals is provided in an analog format and the other in a digital format.

The first signal is a monitored output signal, which provides a sample of the output signal that is generated by amplifier 110 on line 103 (as shown in FIG. 1). This configuration may be viewed as a part of a feed-back control circuit in the sense that the sample of the output signal is used for generating the control signal (on line 102), which is then used to configure 102. However, it must be noted that this feed-back configuration does not merely operate as a gain control feed-back circuit for continuously changing the gain of amplifier 110 in accordance with output signal changes, but operates as a configuration control feedback circuit. The configuration control does not merely operate to change amplifier gain, but is operative to carrying out a host of other functions (switching operations, physical path modification, power supply consumption control etc) based on the monitored (e.g. sampled) output signal, that are described below in more detail.

In addition to being operated upon by functional blocks 410, 415, 420, 423, 425 and 430 for obtaining related information (power level, voltage level, bandwidth, and spectral data), the monitored output signal may also be provided to VSWR detector 435 and/or load mismatch detector 440. One or both of these functional blocks may be used to determine an impact of an output load (described below using FIG. 5) that is connected to line 103 of amplifier 110. VSWR detector 435 and/or load mismatch detector 440 provide information to control signal generator 350 (FIG. 3) for generating the control signal that may be used to manipulate a load matching block in amplifier 110 in order to address and overcome any adverse effect that may be present as a result of the output load upon output signal 103 of amplifier 110. If desired, voltage detector (420) can be used to detect battery voltages and other supply or reference voltages. Temperature detector (423) can be used to detect on-chip or off-chip temperatures, while circuit element detector (424) can be used to measure component parameters such as inductance, capacitance, threshold voltage, and such. If desired, a modulation detector can also be provided. In case of a scalable periphery amplifier as described by U.S. patent application Ser. No. 13/797,779 already mentioned above, the output tunable match may be used for this purpose. Further details about tunable matching networks may be found in example in U.S. Pat. No. 7,795,968 B1, issued on Sep. 14, 2010, which is incorporated herein by reference in its entirety.

The second signal that is provided to measurement circuit 210 is a data input on line 408. Such data may be provided in either digital form or in analog form. Furthermore, the type of data provided may vary from one implementation to another. In one case, the data may be raw data while in another case, the data may be processed data that is generated in a processing device (not shown) such as a processor circuit, an analog-to-digital converter circuit etc. A few examples of data input include temperature data (alternatively or in addition to the temperature data provided by temperature detector (423)), power supply data, battery data, biasing data, various types of signal levels (also inclusive of frequency and/or power levels), logic level conditions (inclusive of mode and/or modulation), switch position data, physical location data that may impact reception of a signal (cellular towers), etc.

The temperature data may be obtained for example by using a temperature probe 120 (see e.g., the alternative embodiment shown in FIG. 2) placed at any suitable monitoring point in amplifier system 100 (shown in FIG. 1). The power supply and/or battery data may be obtained by monitoring voltage and/or current at one or more monitoring points in amplifier system 100. The biasing data may be obtained by monitoring voltage bias at one or more monitoring points in amplifier system 100, such as for example a gate, a drain, and/or a source terminal of a field-effect transistor that is a part of amplifier 110. The physical location data may be obtained by a GPS chip or equivalent included within a portable device (cell phone, tablet, etc.).

Figure 5:
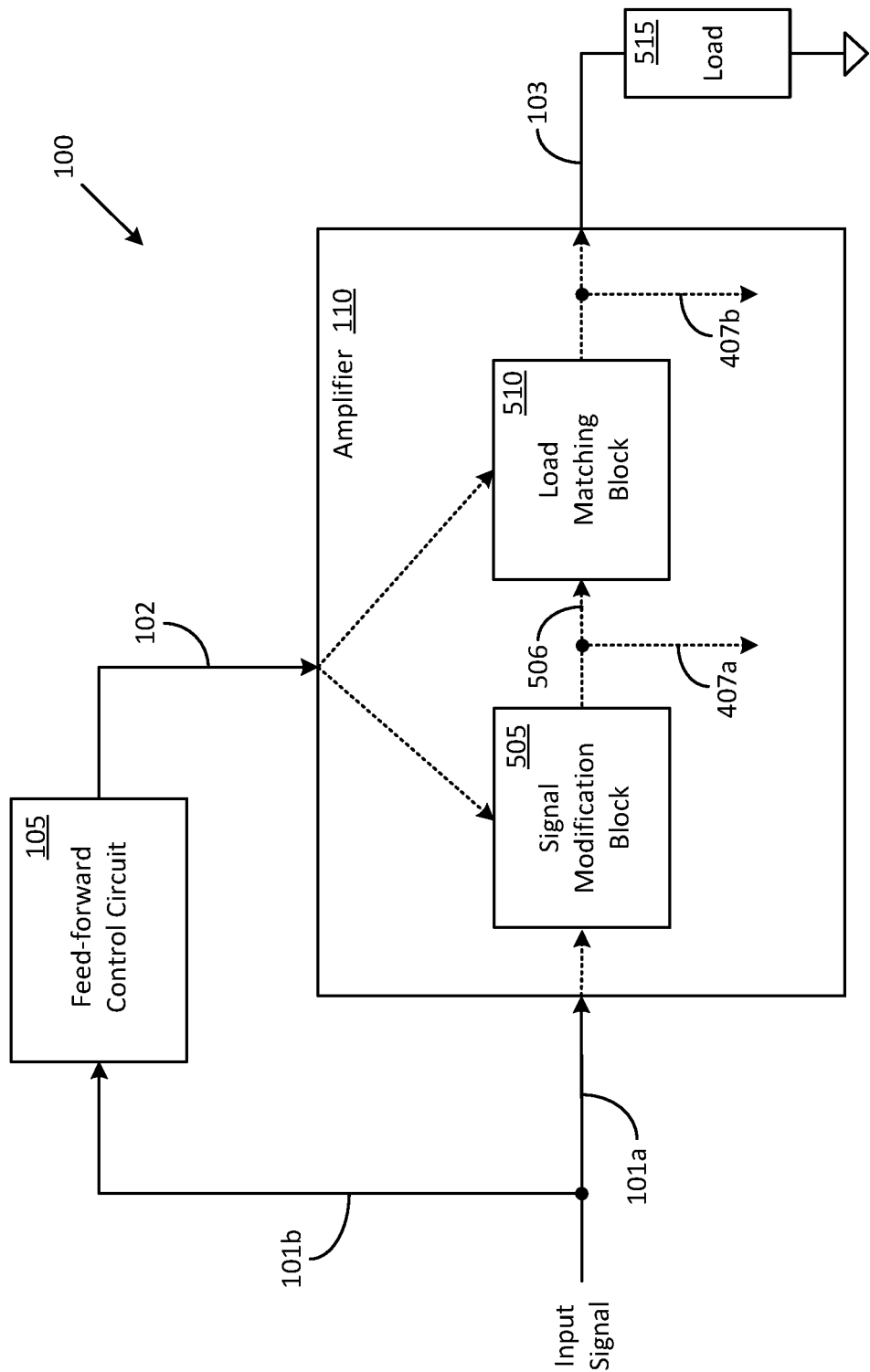
FIG. 5 shows a few components that are contained inside the amplifier shown in FIG. 1.

Attention is now drawn to FIG. 5, which shows a few components of amplifier 110 and the action of feed-forward control circuit 105 upon amplifier 110. The components are shown as two functional blocks that may be used individually or in combination in different embodiments. The functional blocks are intended merely as examples for purposes of description and several additional/alternative functional blocks may be used in various embodiments. Also, one or more blocks may be merged into other blocks in various implementations. For example, load matching block may be merged into signal modification block 505, and may be configured as an inter-stage matching circuit for example.

The control signal provided on line 102 by feed-forward control circuit 105 may be coupled to various elements contained inside amplifier 110. Two such connections, which may be used individually or combinedly, are shown. The first connection is provided to a signal modification block 505, which is described below in more detail using FIG. 6, while the second connection is provided to a load matching block 510. When derived from functional blocks such as VSWR detector 435 or load mismatch detector 440, the control signal is used to configure the load matching block 510 to provide a suitable matching impedance that results in a desired VSWR or desired power level transfer from amplifier 110 into load 515. The skilled person will know various methods of realizing such a load matching block, such as, for example, a tunable matching network.

As a part of this action, an RF load line stored in a memory (not shown) may be used by control signal generator 350 in order to generate a control signal that configures a tunable circuit, for example, contained in load matching block 510, such as a tunable matching network. Configuring the tunable circuit may be implemented in various ways such as by operating switches that switch in/out one or more impedance elements (e.g. capacitors, inductors, etc.), or by providing one or more control voltages to one or more variable impedances (e.g. varactors, tunable capacitors, etc.). Details regarding tunable reactive elements, including tunable capacitors and inductors, are described, for example, in PCT publication number WO2009/108391 entitled "Method and Apparatus for use in Digitally Tuning a Capacitor in an Integrated Circuit Device", published on Sep. 3, 2009, and in U.S. patent application Ser. No. 13/595,893 entitled "Method and Apparatus for Use in Tuning Reactance in an Integrated Circuit Device", filed on Aug. 27, 2012, both incorporated by reference herein in their entirety, where examples of digital tuning capacitors and/or digital tuning inductors for use in a tunable matching network are disclosed. In many embodiments of the present disclosure, the switching circuitry can be constructed using CMOS technology and various architectures known to the skilled person, such as, for example, the architecture presented in U.S. Pat. No. 7,910,993, issued on Mar. 22, 2011 and entitled "Method and Apparatus for use in Improving Linearity of MOSFET's using an Accumulated Charge Sink", and in U.S. Pat. No. 6,804,502, issued on Oct. 12, 2004 and entitled "Switch Circuit and Method of Switching Radio Frequency Signals", both of which are incorporated herein by reference in their entirety.

Furthermore, load matching block 510 may be configured in conjunction with signal modification block 505 in various ways as well. In general, such operations may be directed at carrying out one or more of the following: changing a bias voltage; changing a bias current; changing a supply voltage (for example, by changing the switching frequency of a DC-DC converter, or by operating upon a gain/attenuation element); switching in or out one or more stages of a multi-stage gain unit; modifying the physical size of one or more elements; modifying amplifier gain, phase and/or compression points; and/or enable/disable one or more elements, such as unit cells of a scalable periphery amplifier.

Typically, in the case where amplifier 110 is a power amplifier contained inside a cell phone for example, the power amplifier is configured for maximum efficiency when operated in a saturated mode of operation. However, when the input signal to the power amplifier is reduced, the power amplifier operates further away from saturation and thus operates in a less efficient manner. The sub-optimal performance results in various adverse conditions such as excessive current drain and a resulting reduction in battery life. While certain steps may be taken to reduce the excessive current drain from the battery, care must be taken that such steps are performed in a smooth and intelligent fashion so as to avoid abrupt and undesirable changes in the output signal. For example, cutting out one or more stages of a multi-stage amplifier, or activating/deactivating unit cells within a scalable periphery amplifier, may indeed lead to a reduction in the excessive current. However, if this action is carried out without care, the amplifier's transfer function may be adversely affected and a noticeable and undesirable discontinuity created in the output signal.

The control signal provided by feed-forward control circuit 105 may be used to carry out a smooth transition from one operating condition to another by performing one or more operations upon the signal modification block 505 and/or the load matching block 510. In broad terms, operating upon the signal modification block 505 may be described as altering one or more operating parameters and/or size parameters (such as a current size within an output drain, or impedance/trace size to affect current and/or introduce delay) of amplifier 110. In one embodiment, altering one or more operating parameters may be carried out by using a lookup table 352 that may be a part of feed-forward control circuit 105. The look-up table 352 provides a set of values for various parameters of amplifier 110 that may be altered in a controlled manner without a radical change in the transfer function of amplifier 110 or an abrupt change in output power (e.g. performing a series of small step changes to gradually reach the desired output power). A few examples of the various parameters that may be controlled via the values stored in the look-up table 352 may include: current draw, voltage bias at one or more nodes of amplifier 110, amplitude of the output signal, phase of the output signal, transition times for edges of signals at one or more nodes of amplifier 110, size of the amplifier in case of, e.g., a scalable periphery amplifier like the one disclosed in the above mentioned U.S. patent application Ser. No. 13/797,779, and signal delay. In general, the lookup table 352 can contain any mapping of an input to the feed-forward control circuit (105) with its output connected to the signal modification block (505) as shown in FIG. 5.

Dashed lines 407a and 407b indicate two of several optional monitoring points from which an output monitored signal may be generated by using suitable circuitry (not shown). The monitored output signal is provided to measurement circuit 210 (via line 407) as shown in FIG. 4.

Figure 6:
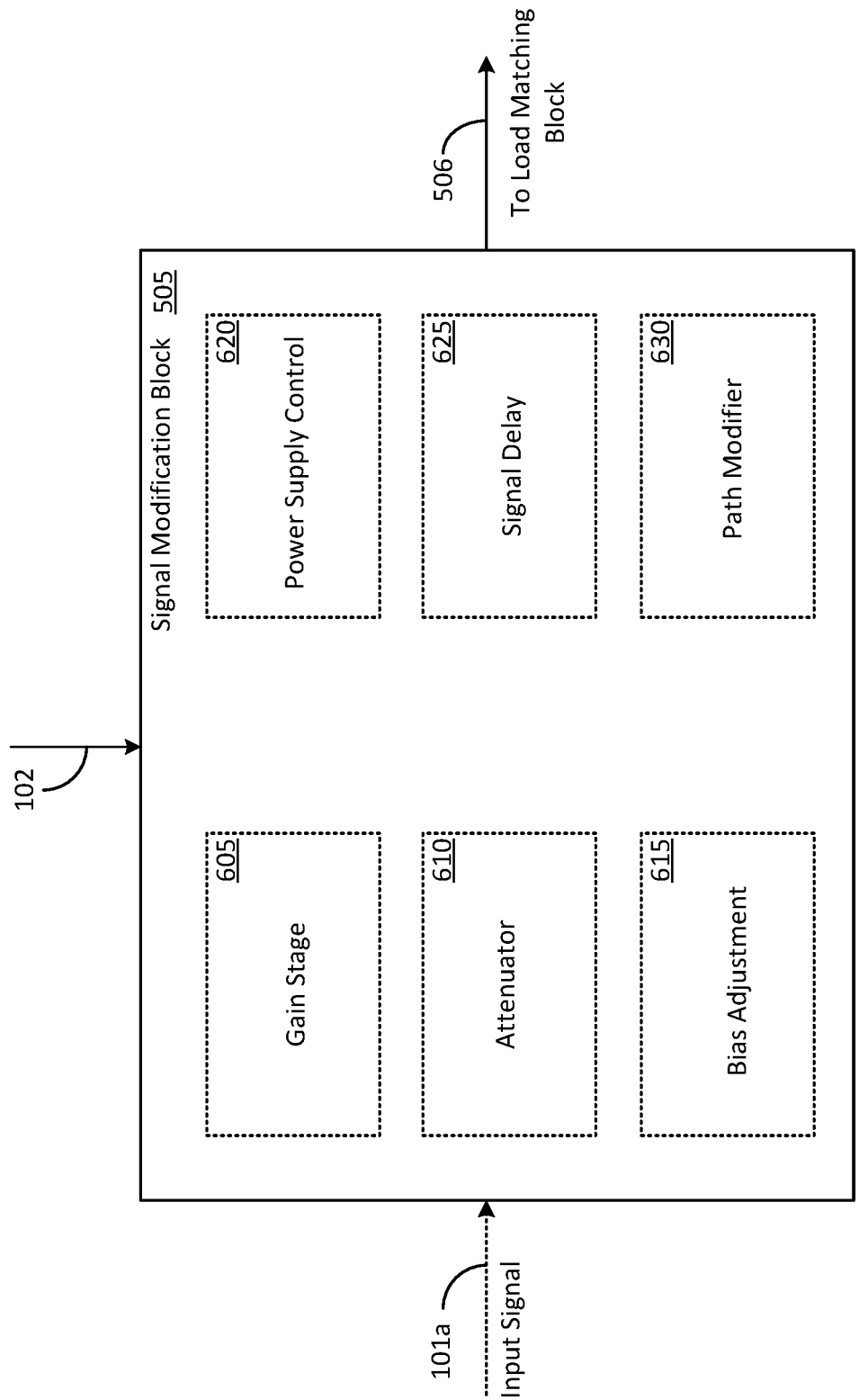
FIG. 6 shows a few components that may be incorporated into a signal modification block of the amplifier shown in FIG. 5.

Attention is now drawn to FIG. 6, which shows some functional blocks that may be included in signal modification block 505. The functional blocks are shown in dashed lines in order to indicate that these functional blocks may be used individually or in various combinations in different embodiments. Furthermore, the functional blocks shown in FIG. 6 are intended merely as examples for purposes of description and several additional/alternative functional blocks may be used in various embodiments. Also, one or more blocks may be merged into other blocks in various implementations. Additionally, if desired, any one of the parameters described in FIG. 6 can be provided by way of a look-up table as described above.

Gain stage 605 may include one more gain stages for amplifying the input signal provided on line 101a. The control signal provided on line 102 may be used to configure gain stage 605 in various ways. For example, the control signal may be used to reduce the overall gain of amplifier 110 by cutting out one or more amplifier stages or unit cells of a scalable periphery amplifier at a suitable time, such as when the input signal is not present on line 101a, thereby avoiding any adverse changes upon the output signal when the input signal is subsequently presented on line 101a.

As yet another example, the control signal provided on line 102 may be used to switch power supply current flow and/or input signal flow through one or more alternative paths. Such switching may be carried out via path modifier 630, which may be included in gain stage 605, and is directed at changing the amount of impedance presented by a signal path for the current flow and/or input signal flow. Changing the amount of impedance may be carried out by inserting or removing various components such as resistors, inductors, PCB tracks, and other impedance elements. Such path modifier may include a tunable matching network such as described in the above mentioned U.S. application Ser. No. 13/797,779, incorporated herein by reference in its entirety. The power supply current aspects may be addressed by the control signal via power supply control 620, which may include suitable switches and other control circuitry. The control circuitry may include one or more circuits that are used to change the switching frequency (and consequently, the output voltage) of a switching supply when used in amplifier 110.

Bias adjustment 615 may be used for various purposes. For example, when it is desired to reduce (or increase) current/power consumption in amplifier 110, bias adjustment 615 may be configured to reduce the amount of current provided to one or more stages. Such reduction may be carried out in a gradual manner thereby avoiding abrupt changes upon the amplification action performed by amplifier 110. Furthermore, in one embodiment, the reduction in current may be carried out in conjunction with attenuator 610, which may be included inside bias adjustment 615. Conversely, current provided to one or more stages may be increased if so desired (for example, to provide more output power from amplifier 110). Other examples of bias adjustments to affect amplifier response are presented, for example, in the above mentioned U.S. application Ser. No. 13/797,779, incorporated herein by reference in its entirety.

Signal delay 625 may be used in certain applications where it is desired to carry out real-time functions upon the input signal. To elaborate upon this aspect, attention is drawn to FIG. 1, which shows the input signal provided via line 101b to feed-forward control circuit 105. As described above, feed-forward control circuit 105 uses this input signal and generates the control signal on line 102. As can be understood, the operations performed in feed-forward control circuit 105 will take a certain amount of time. During this operational delay, the input signal carried on line 110a is presented to amplifier 110 and if left undelayed, will propagate through amplifier 110 without the control signal being available for application upon the input signal at that instant in time. This may be undesirable in certain real-time applications. Consequently, signal delay block 625 shown in FIG. 6 is used to provide a signal delay that may be equal to, or greater than, the amount of time feed-forward control circuit 105 takes to generate the control signal.

It will be understood, however, that in non-real time applications (for example, when the input signal is of a repetitive and relatively time-invariant nature), signal delay 625 may be controllably cut out using the control signal, or completely eliminated. The delay in feed-forward control circuit 105 is inconsequential because the control signal may be applied upon amplifier 110 so as to affect a different portion of the input signal, without any adverse impact of such an action upon the overall system performance. Alternatively, the delay can also be used in a non-real time manner to adjust delays within the circuits and system.

Figure 7:
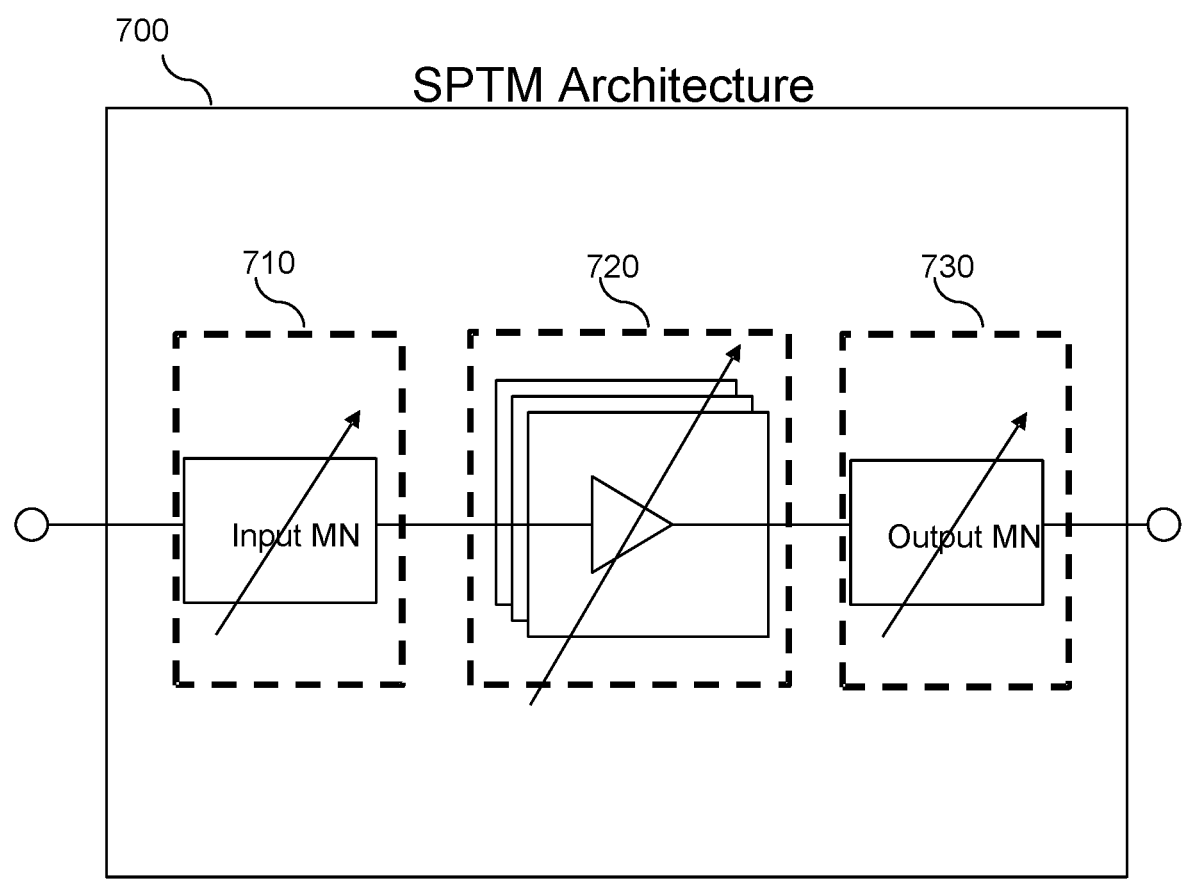
FIG. 7 show an exemplary scalable periphery tunable matching (SPTM) power amplifier architecture.

FIG. 7 shows an exemplary scalable periphery tunable matching (SPTM) power amplifier architecture 700 that may be used as the amplifier 110 of FIG. 5 under the control of line 102. A similar architecture can also be found in U.S. Pat. No. 7,170,341, issued on Jan. 30, 2007 and entitled "Low Power Consumption Adaptive Power Amplifier". By way of example, and not of limitation, the SPTM power amplifier architecture 700 can further comprise a tunable input matching network 710 connected to the input of a scalable periphery amplifier 720, the output of which is connected to a tunable output matching network 730. The scalable periphery amplifier 720 comprises a plurality of unit cells. Varying amplifier power levels (i.e., gain) can be accommodated by selectively activating or deactivating such unit cells by means of a coupled control signal. Operation and details of particular embodiments of the SPTM power amplifier architecture 700 are as set forth in U.S. patent application Ser. No. 13/797,779 already mentioned above.

The person skilled in the art will also appreciate that the systems, components, and methods described herein allow for optimized amplifier operations. While the devices and methods have been described by means of specific embodiments and applications thereof, it is understood that numerous modifications and variations could be made thereto by those skilled in the art without departing from the spirit and scope of the disclosure. It is therefore to be understood that, within the scope of the claims, the disclosure may be practiced otherwise than as specifically described herein.

A person skilled in the art will also be aware that the architecture of the present disclosure (e.g. as shown in the attached figures) may be constructed on a single chip where all components are integrated monolithically, or alternatively some components may be partially integrated (or not at all). Various configurations and corresponding partitioning within a single or multiple chips may depend on the used components and related technologies.

The techniques disclosed in the present application can be further applied in conjunction with other amplifier efficiency improvement and performance techniques such as analog pre-distortion, digital pre-distortion, Doherty amplifiers, LINC (linear amplification with nonlinear components) or outphasing amplifiers, switching amplifiers such as Class S and Class M, and also distributed amplifiers, among others. The skilled person will thus appreciate the flexibility and adaptability of the various embodiments of this disclosure to other known configurations and techniques. Additionally, although several embodiments of the present disclosure are directed at RF amplifiers, the person skilled in the art will understand that such embodiments can be applied to other amplifiers as well, such as audio, cable distribution, and other types of amplifiers.

A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A system for optimizing amplifier operations, including:
    (a) an amplifier configured to receive an input signal and a control signal, and generate an output signal in response to the input signal and the control signal, the output signal having a desired characteristic that includes at least one of a power level, amplifier gain, a voltage range, or a current level, wherein the control signal modifies an operating characteristic of the amplifier; and
    (b) a feed-forward control circuit, coupled to the amplifier, configured to receive the input signal, analyze the input signal using a bandwidth detector, generate the control signal based on the analyzed input signal, and provide the control signal to the amplifier;
    wherein the feed-forward control circuit is further configured to receive as inputs at least one of (a) a control data signal from a control circuit and/or (b) at least one derived data signal from a measurement circuit, wherein any of such inputs may be used in addition to, or in lieu of, the input signal to generate the control signal; and
    wherein the at least one derived data signal represents one or more of: power level data obtained from a monitored output signal from the amplifier, temperature data, power supply data, battery data, biasing data, signal level data, voltage level data, frequency data, power level data, logic level conditions, switch position data, physical location data, mode of operation of the amplifier, a modulation format of the output signal, and/or load mismatch data.

2. The system of claim 1, wherein the amplifier includes a signal modification block, and wherein the control signal configures the signal modification block.

3. The system of claim 2, wherein the signal modification block includes one or more of: a gain stage block, an attenuator block, a bias adjustment block, a power supply control block, a signal delay block, or a path modifier block, wherein at least one included block has one or more parameters alterable by the control signal input to reconfigure the signal modification block.

4. The system of claim 1, wherein the amplifier includes a load matching block, and wherein the control signal configures the load matching block.

5. The system of claim 4, wherein the load matching block is configurable by one or more of: matching impedances to provide a desired Voltage Standing Wave Ratio (VSWR) or desired power level transfer from the amplifier into a load, switching one or more impedance elements in or out of circuit in a tunable matching network, providing one or more control voltages to one or more variable impedances in the tunable matching network, changing a bias voltage, changing a bias current, changing a supply voltage, switching in or out one or more stages of a multi-stage gain unit, modifying a physical size of one or more elements, modifying amplifier gain, modifying amplifier phase, modifying amplifier compression points, and/or enabling or disabling one or more elements.

6. A system for optimizing amplifier operations, including:
    (a) an amplifier configured to receive an input signal and a control signal, and generate an output signal in response to the input signal and the control signal, the output signal having a desired characteristic that includes at least one of a power level, amplifier gain, a voltage range, or a current level, wherein the control signal modifies an operating characteristic of the amplifier; and (b) a feed-forward control circuit, coupled to the amplifier, configured to receive the input signal, analyze the input signal using a modulation detector for detecting the modulation characteristics of the input signal, generate the control signal based on the analyzed input signal, and provide the control signal to the amplifier;

wherein the feed-forward control circuit is further configured to receive as inputs at least one of (a) a control data signal from a control circuit and/or (b) at least one derived data signal from a measurement circuit, wherein any of such inputs may be used in addition to, or in lieu of, the input signal to generate the control signal; and wherein the at least one derived data signal represents one or more of: power level data obtained from a monitored output signal from the amplifier, temperature data, power supply data, battery data, biasing data, signal level data, voltage level data, frequency data, power level data, logic level conditions, switch position data, physical location data, mode of operation of the amplifier, a modulation format of the output signal, and/or load mismatch data.

7. The system of claim 6, wherein the amplifier includes a signal modification block, and wherein the control signal configures the signal modification block.

8. The system of claim 7, wherein the signal modification block includes one or more of: a gain stage block, an attenuator block, a bias adjustment block, a power supply control block, a signal delay block, or a path modifier block, wherein at least one included block has one or more parameters alterable by the control signal input to reconfigure the signal modification block.

9. The system of claim 6, wherein the amplifier includes a load matching block, and wherein the control signal configures the load matching block.

10. The system of claim 9, wherein the load matching block is configurable by one or more of: matching impedances to provide a desired Voltage Standing Wave Ratio (VSWR) or desired power level transfer from the amplifier into a load, switching one or more impedance elements in or out of circuit in a tunable matching network, providing one or more control voltages to one or more variable impedances in the tunable matching network, changing a bias voltage, changing a bias current, changing a supply voltage, switching in or out one or more stages of a multi-stage gain unit, modifying a physical size of one or more elements, modifying amplifier gain, modifying amplifier phase, modifying amplifier compression points, and/or enabling or disabling one or more elements.

11. A system for optimizing amplifier operations, including:

(a) an amplifier configured to receive an input signal and a control signal, and generate an output signal in response to the input signal and the control signal, the output signal having a desired characteristic that includes at least one of a power level, amplifier gain, a voltage range, or a current level; and (b) a feed-forward control circuit, coupled to the amplifier, configured to receive the input signal, analyze the input signal using a spectral analyzer, generate the control signal based on the analyzed input signal, and provide the control signal to the amplifier.

12. The system of claim 11, wherein the feed-forward control circuit is further configured to receive as inputs at least one of (a) a control data signal from a control circuit and/or (b) at least one derived data signal from a measurement circuit, wherein any of such inputs may be used in addition to, or in lieu of, the input signal to generate the control signal.

13. The system of claim 12, wherein the at least one derived data signal represents one or more of: power level data obtained from a monitored output signal from the amplifier, temperature data, power supply data, battery data, biasing data, signal level data, voltage level data, frequency data, power level data, logic level conditions, switch position data, physical location data, mode of operation of the amplifier, a modulation format of the output signal, and/or load mismatch data.

14. The system of claim 11, wherein the amplifier includes a signal modification block, and wherein the control signal configures the signal modification block.

15. The system of claim 14, wherein the signal modification block includes one or more of: a gain stage block, an attenuator block, a bias adjustment block, a power supply control block, a signal delay block, or a path modifier block, wherein at least one included block has one or more parameters alterable by the control signal input to reconfigure the signal modification block.

16. The system of claim 11, wherein the amplifier includes a load matching block, and wherein the control signal configures the load matching block.

17. The system of claim 16, wherein the load matching block is configurable by one or more of: matching impedances to provide a desired Voltage Standing Wave Ratio (VSWR) or desired power level transfer from the amplifier into a load, switching one or more impedance elements in or out of circuit in a tunable matching network, providing one or more control voltages to one or more variable impedances in the tunable matching network, changing a bias voltage, changing a bias current, changing a supply voltage, switching in or out one or more stages of a multi-stage gain unit, modifying a physical size of one or more elements, modifying amplifier gain, modifying amplifier phase, modifying amplifier compression points, and/or enabling or disabling one or more elements.

18. A system for optimizing amplifier operations, including:

(a) an amplifier configured to receive an input signal and a control signal, and generate an output signal in response to the input signal and the control signal, the output signal having a desired characteristic that includes at least one of a power level, amplifier gain, a voltage range, or a current level, wherein the control signal modifies an operating characteristic of the amplifier; and (b) a feed-forward control circuit, coupled to the amplifier, configured to receive the input signal, analyze the input signal using a bandwidth detector, generate the control signal based on the analyzed input signal, and provide the control signal to the amplifier;

wherein the amplifier includes a load matching block, and wherein the control signal configures the load matching block.

19. The system of claim 18, wherein the load matching block is configurable by one or more of: matching impedances to provide a desired Voltage Standing Wave Ratio (VSWR) or desired power level transfer from the amplifier into a load, switching one or more impedance elements in or out of circuit in a tunable matching network, providing one or more control voltages to one or more variable impedances in the tunable matching network, changing a bias voltage, changing a bias current, changing a supply voltage, switching in or out one or more stages of a multi-stage gain unit, modifying a physical size of one or more elements, modifying amplifier gain, modifying amplifier phase, modifying amplifier compression points, and/or enabling or disabling one or more elements.

20. A system for optimizing amplifier operations, including:
(a) an amplifier configured to receive an input signal and a control signal, and generate an output signal in response to the input signal and the control signal, the output signal having a desired characteristic that includes at least one of a power level, amplifier gain, a voltage range, or a current level, wherein the control signal modifies an operating characteristic of the amplifier; and
(b) a feed-forward control circuit, coupled to the amplifier, configured to receive the input signal, analyze the input signal using a modulation detector for detecting the modulation characteristics of the input signal, generate the control signal based on the analyzed input signal, and provide the control signal to the amplifier; wherein the amplifier includes a load matching block, and wherein the control signal configures the load matching block.

21. The system of claim 20, wherein the load matching block is configurable by one or more of: matching impedances to provide a desired Voltage Standing Wave Ratio (VSWR) or desired power level transfer from the amplifier into a load, switching one or more impedance elements in or out of circuit in a tunable matching network, providing one or more control voltages to one or more variable impedances in the tunable matching network, changing a bias voltage, changing a bias current, changing a supply voltage, switching in or out one or more stages of a multi-stage gain unit, modifying a physical size of one or more elements, modifying amplifier gain, modifying amplifier phase, modifying amplifier compression points, and/or enabling or disabling one or more elements.

* * * * *